United States Patent [19]
Ashley et al.

[11] Patent Number: 5,969,649
[45] Date of Patent: Oct. 19, 1999

[54] RUN LENGTH LIMITED ENCODING/ DECODING WITH ROBUST RESYNC

[75] Inventors: Jonathan James Ashley, Los Gatos, Calif.; Glen Alan Jaquette, Tucson, Ariz.; Brian Harry Marcus, Los Altos, Calif.; Paul Joseph Seger, Tucson, Ariz.

[73] Assignee: International Business Machines Corporation, Armonk, N.Y.

[21] Appl. No.: 09/024,991

[22] Filed: Feb. 17, 1998

[51] Int. Cl.⁶ ............................................... H03M 7/46
[52] U.S. Cl. .............................................................. 341/59
[58] Field of Search ................................. 341/59, 53, 58, 341/55; 360/40

[56] References Cited

U.S. PATENT DOCUMENTS

| | | | |
|---|---|---|---|
| 4,553,237 | 11/1985 | Nakamura | 371/37 |
| 4,899,340 | 2/1990 | Lubarsky | 371/37.1 |
| 5,333,126 | 7/1994 | Fukuda et al. | 369/59 |
| 5,451,943 | 9/1995 | Satomura | 341/58 |
| 5,682,153 | 10/1997 | Ishiguro | 341/53 |

*Primary Examiner*—Brian Young
*Attorney, Agent, or Firm*—John Holcombe; Robert M. Sullivan

[57] ABSTRACT

Disclosed are robust Resync patterns for insertion into a run length limited (d,k) encoded channel bit stream, which Resync pattern may be recovered from the RLL (d,k) encoded bit stream without being confused with data. The Resync pattern includes at least one string of consecutive "0"s which exceeds the RLL (k) constraint, and is inserted into the channel bit stream RLL data codewords. The RLL code excludes certain patterns representing a bit shift from the Resync pattern of one or both "1" bits adjacent to the string of "0" bits, shifted to shorten the Resync pattern to within the (k) constraint. Additionally, the Resync pattern may have two different aspects, one of which is the string of "0"s violating the constraints of the RLL code, and another which is specifically excluded from the RLL code, such as an excluded concatenated sequence of a VFO bit pattern of predetermined length or greater.

45 Claims, 7 Drawing Sheets

| X/Y | 1 | 2 | 3 | 4 | 5 | 6 | 7 |
|---|---|---|---|---|---|---|---|
| 1 | 9/10 | d/11 | a/10 b/11 3/12 | c/11 0/1 4/12 | 1/1 5/12 | e/11 6/12 8/10 | f/11 2/1 7/12 |
| 2 | 9/20 |  | a/20 b/21 | c/19 0/1 4/14 | d/19 1/1 5/14 | e/21 2/19 6/14 8/20 | f/21 3/19 7/14 |
| 3 | 1/5 9/2 | d/3 | a/2 b/3 2/5 3/4 | c/3 4/4 | 5/4 | e/3 0/5 6/4 8/2 | f/3 7/4 |
| 4 | 1/18 9/15 | d/16 | a/15 b/16 2/18 3/17 | c/16 4/17 | 5/17 | e/16 0/18 6/17 8/15 | f/16 7/17 |
| 5 | 9/20 | 1/21 | a/20 b/21 4/14 | c/19 0/21 | d/19 5/14 | e/21 2/19 6/14 8/20 | f/21 3/19 7/14 |
| 6 | 9/7 | d/8 | a/7 b/8 0/6 4/9 | c/8 | 1/6 5/9 | e/8 2/6 6/9 8/7 | f/8 3/6 7/9 |
| 7 | 1/13 9/10 | d/11 | a/10 b/11 2/13 3/12 | c/11 4/12 | 5/12 | e/11 0/13 6/12 8/10 | f/11 7/12 |

ENCODER TABLE
(Present state is row index and next state is column index)

*FIG. 3*

| | | | | | | | |
|---|---|---|---|---|---|---|---|
| 1 | 000000 | 2 | 000001 | 3 | 000010 | 4 | 000100 |
| 5 | 000101 | 6 | 001000 | 7 | 001001 | 8 | 001010 |
| 9 | 010000 | 10 | 010001 | 11 | 010010 | 12 | 010100 |
| 13 | 010101 | 14 | 100000 | 15 | 100001 | 16 | 100010 |
| 17 | 100100 | 18 | 100101 | 19 | 101000 | 20 | 101001 |
| 21 | 101010 | | | | | | |

LIST OF OUTPUT LABELS AND CORRESPONDING INTEGERS

*FIG. 4*

| ENCODER (44 GATES) |
|---|
| PRESENT STATE=$s_2 s_1 s_0$<br>USER WORD=$b_3 b_2 b_1 b_0$ |
| INTERMEDIATE VARIABLES |
| $y_0 = b_1 b_0 + b_2$<br>$y_1 = c_5 + s_1$<br>$y_2 = s_0 + s_1$ |
| ENCODER OUTPUT WORD |
| $c_5 = \bar{s}_2 \bar{s}_0 b_2 + \bar{s}_2 c_3 + s_2 \bar{s}_1$<br>$c_4 = s_2 \bar{c}_5 \bar{c}_3 + y_0 \bar{y}_1 + c_0 \bar{y}_1$<br>$c_3 = s_1 \bar{s}_0 \bar{b}_2 b_1 + s_2 s_1 \bar{s}_0 \bar{b}_2 + s_2 \bar{s}_1 s_0 \bar{b}_2 + s_2 \bar{s}_1 s_0 b_3 + s_1 \bar{s}_0 b_3$<br>$c_2 = \bar{s}_2 s_0 \bar{b}_3 y_0 + s_1 s_0 \bar{b}_3 + \bar{b}_3 \bar{y}_2$<br>$c_1 = \bar{b}_2 \bar{b}_1 c_5 \bar{c}_0 + s_2 \bar{s}_0 b_3 \bar{c}_0 + b_3 \bar{c}_3 \bar{c}_0 + b_3 b_1 \bar{c}_0$<br>$c_0 = c_2 \bar{y}_0 + b_3 \bar{y}_0$ |
| ENCODER NEXT STATE |
| $t_2 = \bar{c}_2 \bar{c}_1 \bar{c}_0 + b_2 c_2 + \bar{b}_1 \bar{b}_0 + b_2 b_1$<br>$t_1 = \bar{b}_0 c_0 + \bar{t}_2 c_1 + b_1$<br>$t_0 = \bar{b}_2 b_1 \bar{c}_3 + \bar{t}_1 c_0 + b_1 \bar{t}_2 + b_0 t_2$ |

| DATA IN | 1 DATA OUT | 1 NEXT STATE | 2 DATA OUT | 2 NEXT STATE | 3 DATA OUT | 3 NEXT STATE | 4 DATA OUT | 4 NEXT STATE | 5 DATA OUT | 5 NEXT STATE | 6 DATA OUT | 6 NEXT STATE | 7 DATA OUT | 7 NEXT STATE |
|---|---|---|---|---|---|---|---|---|---|---|---|---|---|---|
| 0000 | 000000 | 4 | 000000 | 4 | 000101 | 6 | 100101 | 6 | 101010 | 4 | 001000 | 4 | 010101 | 6 |
| 0001 | 000000 | 5 | 000000 | 5 | 000101 | 1 | 100101 | 1 | 101010 | 2 | 001000 | 5 | 010101 | 1 |
| 0010 | 000000 | 7 | 101000 | 6 | 000101 | 3 | 100101 | 3 | 101000 | 6 | 001000 | 6 | 010101 | 3 |
| 0011 | 010100 | 3 | 101000 | 7 | 000100 | 3 | 100100 | 3 | 101000 | 7 | 001000 | 7 | 010100 | 3 |
| 0100 | 010100 | 4 | 100000 | 4 | 000100 | 4 | 100100 | 4 | 100000 | 4 | 010000 | 4 | 010100 | 4 |
| 0101 | 010100 | 5 | 100000 | 5 | 000100 | 5 | 100100 | 5 | 100000 | 5 | 010000 | 5 | 010100 | 5 |
| 0110 | 010100 | 6 | 100000 | 6 | 000100 | 6 | 100100 | 6 | 100000 | 6 | 010000 | 6 | 010100 | 6 |
| 0111 | 010100 | 7 | 100000 | 7 | 000100 | 7 | 100100 | 7 | 100000 | 7 | 010000 | 7 | 010100 | 7 |
| 1000 | 010001 | 6 | 101001 | 6 | 000001 | 6 | 100001 | 6 | 101001 | 6 | 001001 | 6 | 010001 | 6 |
| 1001 | 010001 | 1 | 101001 | 1 | 000001 | 1 | 100001 | 1 | 101001 | 1 | 001001 | 1 | 010001 | 1 |
| 1010 | 010001 | 3 | 101001 | 3 | 000001 | 3 | 100001 | 3 | 101001 | 3 | 001001 | 3 | 010001 | 3 |
| 1011 | 010010 | 3 | 101001 | 3 | 000010 | 3 | 100010 | 3 | 101010 | 3 | 001010 | 3 | 010010 | 3 |
| 1100 | 010010 | 4 | 101010 | 4 | 000010 | 4 | 100010 | 4 | 101000 | 4 | 001010 | 4 | 010010 | 4 |
| 1101 | 010010 | 2 | 101000 | 5 | 000010 | 2 | 100010 | 2 | 101000 | 5 | 001010 | 2 | 010010 | 2 |
| 1110 | 010010 | 6 | 101010 | 6 | 000010 | 6 | 100010 | 6 | 101010 | 6 | 001010 | 6 | 010010 | 6 |
| 1111 | 010010 | 7 | 101010 | 7 | 000010 | 7 | 100010 | 7 | 101010 | 7 | 001010 | 7 | 010010 | 7 |

(Header spans: CURRENT STATE across columns 1–7.)

In this table the rows are indexed by the 16 possible data input values, and the columns are indexed by the 7 current states of the encoder. For each combination of input data, and current state, the table shows the output data, and the resultant state. The RLL encoder shall be placed into state 7 at the beginning of every Codeword Pair Header.

FIG. 6

| PRESENT STATE(S) | RESYNC |
|---|---|
| 1,7 | 010010.000000.010101.010101 |
| 2,5 | 101010.000000.010101.010101 |
| 3 | 000010.000000.010101.010101 |
| 4 | 100010.000000.010101.010101 |
| 6 | 001010.000000.010101.010101 |

The Resync as a function of the present state of the encoder going into the encode of the Resync.
Note that the encoded codeword following the bit patterns always begins with "010".

*FIG. 7*

| | 1 | 2 | 3 | 4 | 5 | 6 | 7 | 8 | 9 | 10 | 11 | 12 | 13 | 14 | 15 | 16 | 17 | 18 | 19 | 20 | 21 |
|---|---|---|---|---|---|---|---|---|---|---|---|---|---|---|---|---|---|---|---|---|---|
| 1 | | | | | | | | | | 2 | 2 | 2 | 2 | 1 | 0 | 0 | 0 | 0 | 1 | 1 | 1 |
| 2 | | 9 | a | a | a | a | 8 | 8 | 8 | 8 | 9 | 9 | 9 | | | | | | | | |
| 3 | | d | b | b | b | b | e | e | e | e | f | f | f | d | c | c | c | c | d | d | d |
| 4 | | | 3 | 3 | 3 | 3 | 6 | 6 | 6 | 6 | 7 | 7 | 7 | 5 | 4 | 4 | 4 | 4 | 5 | 5 | 5 |
| 5 | 1 | 2 | 2 | 2 | 2 | 0 | 0 | 0 | 0 | 1 | 1 | 1 | | | | | | | | | |
| 6 | | | | | | 2 | 2 | 2 | 2 | 3 | 3 | 3 | 3 | 1 | 0 | 0 | 0 | 0 | 1 | 1 | 1 |
| 7 | | 9 | a | a | a | a | 8 | 8 | 8 | 8 | 9 | 9 | 9 | | | | | | | | |
| 8 | | d | b | b | b | b | e | e | e | e | f | f | f | d | c | c | c | c | d | d | d |
| 9 | | | | | | | 6 | 6 | 6 | 6 | 7 | 7 | 7 | 5 | 4 | 4 | 4 | 4 | 5 | 5 | 5 |
| 10 | | 9 | a | a | a | a | 8 | 8 | 8 | 8 | 9 | 9 | 9 | | | | | | | | |
| 11 | | d | b | b | b | b | e | e | e | e | f | f | f | d | c | c | c | c | d | d | d |
| 12 | | | 3 | 3 | 3 | 3 | 6 | 6 | 6 | 6 | 7 | 7 | 7 | 5 | 4 | 4 | 4 | 4 | 5 | 5 | 5 |
| 13 | 1 | 2 | 2 | 2 | 2 | 0 | 0 | 0 | 0 | 1 | 1 | 1 | | | | | | | | | |
| 14 | | | | | | | 6 | 6 | 6 | 6 | 7 | 7 | 7 | 5 | 4 | 4 | 4 | 4 | 5 | 5 | 5 |
| 15 | | 9 | a | a | a | a | 8 | 8 | 8 | 8 | 9 | 9 | 9 | | | | | | | | |
| 16 | | d | b | b | b | b | e | e | e | e | f | f | f | d | c | c | c | c | d | d | d |
| 17 | | | 3 | 3 | 3 | 3 | 6 | 6 | 6 | 6 | 7 | 7 | 7 | 5 | 4 | 4 | 4 | 4 | 5 | 5 | 5 |
| 18 | 1 | 2 | 2 | 2 | 2 | 0 | 0 | 0 | 0 | 1 | 1 | 1 | | | | | | | | | |
| 19 | | | | | | 2 | 2 | 2 | 2 | 3 | 3 | 3 | 3 | d | c | c | c | c | d | d | d |
| 20 | | 9 | a | a | a | a | 8 | 8 | 8 | 8 | 9 | 9 | 9 | | | | | | | | |
| 21 | 1 | b | b | b | b | e | e | e | e | f | f | f | | 1 | 0 | 0 | 0 | 0 | 1 | 1 | 1 |

TABLE: SLIDING BLOCK DECODER
(Present channel word is row index and next channel word is column index)

*FIG. 8*

| DECODER (47 GATES) |
|---|
| PRESENT CHANNEL WORD=$c_5c_4c_3c_2c_1c_0$<br>NEXT CHANNEL WORD=$d_5d_4d_3d_2d_1d_0$ |
| INTERMEDIATE VARIABLES |
| $x_0 = \bar{d}_5 \bar{d}_3$<br>$x_1 = d_2 + d_4$<br>$x_2 = d_0 + d_3$<br>$x_3 = \bar{d}_1 x_0$<br>$x_4 = d_0 + d_2$<br>$x_5 = \bar{c}_0 \bar{c}_3 \bar{c}_1$<br>$x_6 = d_0 + d_1$<br>$x_7 = d_3 + d_4$<br>$x_8 = c_1 \bar{c}_2 \bar{c}_4$<br>$x_9 = c_5 + c_2 + c_4$<br>$x_{10} = \bar{d}_0 d_1 \bar{d}_2 \bar{d}_3 \bar{d}_5$ |
| DECODED USER WORD |
| $b_3 = c_5 c_3 \bar{c}_1 d_5 + x_1 x_3 x_8 + \bar{d}_5 x_2 x_8 + x_8 x_{10} + \bar{c}_5 x_8 + \bar{c}_2 c_0 + \bar{c}_3 c_1$<br>$b_2 = x_5 x_7 x_9 + \bar{d}_5 x_5 x_9 + b_3 b_1 x_7 + \bar{c}_0 b_3 \bar{b}_1$<br>$b_1 = \bar{d}_4 x_0 x_6 + \bar{d}_5 \bar{d}_4 d_2 + \bar{c}_0 \bar{d}_5 d_3 + \bar{c}_0 d_4$<br>$b_0 = c_3 d_4 x_{10} + \bar{x}_4 \bar{x}_6 \bar{x}_7 + \bar{c}_0 x_0 \bar{x}_7 + b_2 x_0 x_6 + d_4 \bar{b}_1 x_6 + c_3 d_4 x_4$<br>$\quad + d_2 b_2 x_3 + d_4 d_2 \bar{b}_1 + d_5 d_3$ |

*FIG. 9*

RUN LENGTH LIMITED ENCODING/ DECODING WITH ROBUST RESYNC

TECHNICAL FIELD

This invention relates to the encoding and decoding of run length limited codes and, more particularly, to the use of resync characters in the codeword areas of the data sets to synchronize the phase of codewords.

BACKGROUND OF THE INVENTION

The use of run length limited (RLL) binary codes is prevalent in the data transmission and data recording arts for encoding an unconstrained set of binary data into a constrained set of codewords having a minimum distance (d) of "0"s between "1"s (or recording transitions) and a maximum distance (k) of "0"s between "1"s. Run length limited (d,k) codes of various types are utilized for data transmission and for magnetic and optical data recording. One example is a set of variable length codes described in coassigned U.S. Pat. No. 3,689,899, Franaszek, issued Sep. 5, 1972. Another example is described in coassigned U.S. Pat. No. 4,413,251, Adler et al., issued Nov. 1, 1983, of an encoder for generating a noiseless sliding block RLL (1,7) code, with a 2:3 rate. The 2:3 rate means that for each 2 input (source) binary bits, a codeword of 3 output (channel) binary bits is generated, each "1" binary bit of the codeword representing a bit clock time with a transition, and each "0" binary bit representing a bit clock time without a transition.

A data set will include a VFO pattern at a specific location (typically a header) and of a particular known transition frequency to synchronize the read clock (typically a phase locked loop or PLL) to the codeword bit frequency. The VFO pattern is typically a repetitive codeword pattern, but which is identifiable because of its location in a header.

A known sync pattern is typically also provided between the VFO pattern and any encoded data to allow the RLL decoder to align to the codeword boundaries and to the start location of the incoming encoded data.

If the PLL does not acheive complete phase lock, or if the RLL decoder does not align to the codeword boundaries on the incoming data (either of which may happen if a media defect is present), the RLL decoder will not be able to successfully decode incoming encoded data. But the PLL may complete phase lock in encoded data (if it begins close enough), and the RLL decoder can be aligned if a second RLL synchronization pattern occurs. A second or subsequent RLL synchronization pattern is typically called a resync pattern, or simply a resync. A resync is typically inserted within the data, for example, as illustrated by U.S. Pat. No. 5,451,943, Satomura, issued Sep. 15, 1995. The resync pattern allows the PLL to regain proper phase synchronization with the codewords without substantial loss of data. As pointed out by Satomura, the resync pattern must not be confused with data since the appearance of the data codewords having the same pattern as the resync are likely to be detected instead as a resync pattern and not decoded as data, resulting in the loss of data. Thus, Satomura proposed a Resync pattern for a variable length RLL (1,7) code inserted at specific locations in the code (e.g., at every 20 bytes of input data), which reduces the digital sum value of the encoded data and can be detected. One of the patterns is an "X01000000001" pattern, which exceeds the (k) constraint of the RLL code and cannot be confused with data.

When a sync pattern is not detected (missed) or detected erroneously in the wrong position (e.g., due to a defect), the exact bit position and alignment to RLL codeword boundaries is not known. Accordingly, there is also uncertainty as to the exact location where a resync may be positioned. If this uncertainty in position is as large as the resync, a typical situation which exists in most tape drives, a resync detector will necessarily have to look for the resync in encoded data. For this reason, it is important that the resync be distinct from data, so it should be outside the codeword space of the RLL code used to encode data. To put the resync outside the codeword space of the RLL code, many resyncs are designed to have either a single long string of "0"s which violates the (k) constraint of the code, or a sequence of long strings of "0"s which cannot be encoded naturally, either of which is known as an RLL violation. Resync detectors look for this RLL violation, which should not occur in normally encoded data (in the absence of noise or defects). A difficulty in peak detection channels is that the intersymbol interference of high frequency signals tends to shift the detection of any transition away from an adjacent transition and towards the no transition zone ("0"s). Thus, some detected transistions tend to be shifted into positions such that the detected bit stream may not be detected as a Resync pattern.

SUMMARY OF THE INVENTION

An object of the present invention is to provide an encoder and method for encoding a run length limited code which is unlikely to confuse encoded data with synchronization patterns, and, particularly, with Resync patterns encoded with the data, and for detecting and resolving the data codewords and the Resync patterns.

Another object of the present invention is to provide a robust Resync pattern in RLL encoded data and a method and decoder for detecting and resolving bit shifted signals to decode the codewords and the Resync patterns.

Another object of the present invention is to provide a robust codeword synchronization pattern.

Disclosed are an encoder, decoder, encoder/decoder, data recording medium and method for encoding and decoding a run length limited code, for generating a robust Resync pattern into a channel bit stream, and for recovering the Resync pattern from the RLL encoded bit stream. The data stream is encoded by a run length limited (d,k) code and has at least one Resync pattern therein. The Resync pattern includes at least one string of consecutive "0"s which exceeds the RLL (k) constraint, and is inserted into the channel bit stream.

An RLL encoder encodes the RLL binary bit signals in the channel bit stream from a series of unconstrained binary source signals, the encoder excluding certain patterns from the RLL channel bit stream, the certain patterns representing a bit shift from the Resync pattern of one or both "1" bits adjacent to the occurrence of at least one string of consecutive "0" bits, shifted to shorten the Resync pattern to within the (k) constraint.

A channel is coupled to the resync generator and the RLL encoder for transmitting the encoded bit stream and for receiving the encoded bit stream. A decoder, such as a sliding block decoder, is coupled to the channel output for decoding the encoded bit stream, and a Resync detector recovers the Resync pattern, the Resync detector resolving patterns of the received bit stream including a string of consecutive "0"s in favor of the Resync pattern to accommodate bit shifts from the Resync pattern of one or both "1" bits adjacent to the occurrence of at least one string of consecutive "0" bits, shifted to shorten the Resync pattern to within the (k) constraint.

Additionally, the Resync pattern may have both a low frequency aspect violating the RLL (k) constraint, and have a high frequency aspect which is additionally excluded from the RLL code, such as a concatenated sequence of a bit pattern of predetermined length or greater. The two different aspects further reduce the likelihood of confusion between the Resync pattern and data.

For a fuller understanding of the present invention, reference should be made to the following detailed description taken in conjunction with the accompanying drawings.

BRIEF DESCRIPTION OF THE DRAWINGS

FIG. 3 is a table representing the encoding characteristics of an exemplary encoder of FIG. 1;

FIG. 4 is a list of the output labels of FIG. 3 and the corresponding 6 bit codewords;

FIG. 5 is a table representing the state machine encoder logic of the encoder of FIG. 3;

FIG. 6 is a table illustrating the data input and output for the encoder of FIGS. 3–5;

FIG. 7 is a table illustrating the Resync output based on the state of the encoder of FIGS. 3–6;

FIG. 8 is a table representing the decoding characteristics of an exemplary decoder of FIG. 1;

FIG. 9 is a table representing the state machine decoder logic of the decoder of FIG. 6.

DETAILED DESCRIPTION OF THE INVENTION

Figure 1:
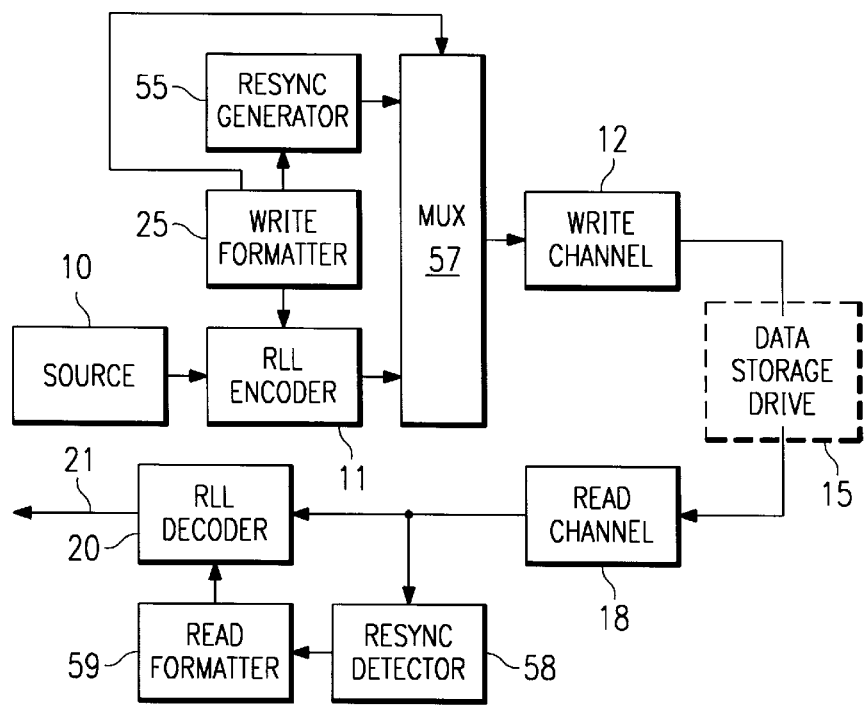
FIG. 1 is a block diagram representation of an encoder and Resync generator, a decoder, and channel of the present invention.

Referring to FIG. 1, a data transmission or data recording system is illustrated in which binary data from a source 10 is encoded for transmission by a run length limited encoder 11, and the encoded data is input to a channel input 12. The channel may comprise a transmission medium or may comprise a data storage drive 15 or other data storage device. The encoded data is received from the channel or read from the data storage device and received at output channel 18 and then decoded by decoder 20 which provides the output binary data on output 21. If the encoding and decoding were done correctly and transmitted without error, the binary output data 21 will be identical to the input binary data from source 10.

Encoding schemes which impose limits on the distances between transitions between two binary states, called run length limited (RLL) binary codes is prevalent in the data transmission and data recording arts for encoding an unconstrained set of binary data into a constrained set of codewords. Such codes may be described as having a minimum distance (d) of "0"s between "1"s (or recording transitions) and a maximum distance (k) of "0"s between "1"s.

Various versions of RLL (d,k) codes have been found to be particularly useful, and may comprise variable length codewords or fixed length codewords, as described above. The input channel 12 and output channel 18 are typically asynchronous, and, if a data storage drive 15 is utilized as an archive device, such as a magnetic tape drive, the output channel may not provide the data for a year or more, when needed to restore a primary storage device. Thus, the encoded data must provide the clocking necessary to allow the output channel 18 to interpret the transitions of the stored data and read the data so that decoder 20 may decode the channel output data. However, the RLL codes do not typically allow a PLL to acquire phase-lock to encoded random data. Therefore, clocking fields are typically appended to the encoded data fields to allow the PLL to achieve phase-lock before entering encoded data fields, which require the PLL's clock to be successfully read.

Typically, headers having the needed clocking information, as well as other needed information, are added to each data set, etc., by write formatter 25. The clocking information may then be utilized by the output or read channel 18 to identify the position of each of the transitions in the encoded data and supply that information to the decoder 20 for decoding the encoded data.

Figure 2:
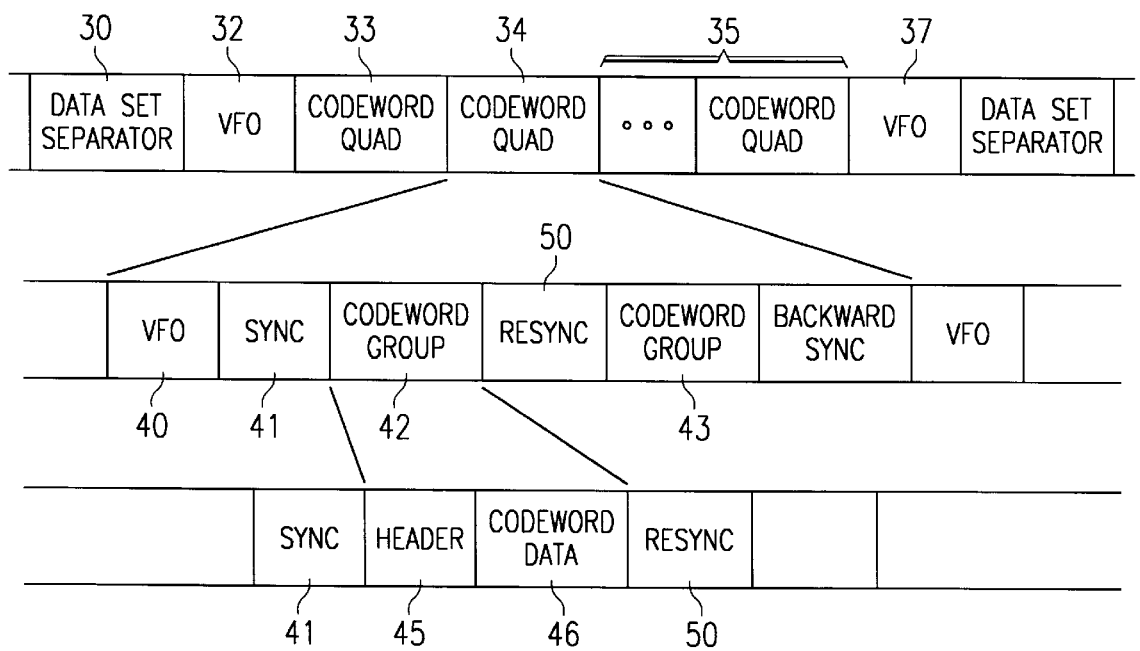
FIG. 2 is a diagrammatic illustration of a recording or channel format of encoded data sets employing the Resync of the present invention.

A typical example of a format of the encoded data is illustrated in FIG. 2. Each data set is separated by a data set separator, or gap 30. When the data is recorded by a data storage tape drive, the gap is sometimes called the "IBG" or interblock gap. The gap is typically followed by a "VFO" area 32, which is utilized by the output channel PLL to bring its operating frequency to that of the VFO area (phase-lock). ("VFO" stands for variable frequency oscillator. Some modern systems no longer use an analog variable frequency oscillator, but the terminology remains in use.) In data recording, the data storage drive may operate at various speeds, therefore causing changes in the data frequency, which must be determined by the PLL by detecting the VFO area frequency.

The VFO area 32 is then followed by the encoded data 33–35, and, in data storage drives that may move forward or backwards, such as magnetic tape, a backwards VFO area 37.

A typical codeword quad 34 is expanded and shown in greater detail. The typical codeword quad includes a header with a leading VFO pattern 40 and a "Sync" pattern 41, and a plurality of codeword groups 42–43. Each of the codeword groups may comprise a short header 45 and the codeword data 46. Codeword groups 42–43 may be of any suitable length, for example, header 45 may be only 10 bytes and the codeword data 480 bytes, for a total of 490 bytes.

The VFO pattern 40 is typically a repetitive codeword pattern, but is identifiable because of its location in a header, and provides a short pattern in which the clock or PLL may adjust to regain the frequency of the VFO area 32. The VFO pattern 40 must be sufficiently long, however, that the frequency can be detected and locked, for example 14 bytes, as compared to the data set VFO 32 which may be a total of 30 bytes, combining a 16 byte data set pattern VFO with the first codeword quad VFO.

The Sync pattern 41 is provided to allow the RLL decoder to determine the start of RLL encoded data, aligning it to the RLL codeword boundaries. Because the Sync pattern is always adjacent to a VFO pattern (as opposed to a resync pattern which typically is not), it should be robustly detectable coming out of a VFO pattern. This does not mean that it must be an RLL violation (as a resync pattern should be). The Sync pattern's location largely eliminates any concern that it will be seen in encoded data.

If the PLL does not acheive phase lock, or if the decoder does not align to the codeword boundaries on the incoming data, it will result in the inability to decode any of the data codewords, as described above. A Resync pattern 50 is therefore typically placed within the data, for example, as illustrated by Satomura. The Resync pattern allows the RLL decoder to regain a position location in encoded data and alignment to RLL codeword boundaries, allowing recovery of subsequent encoded data. It is also possible, though not commonly practiced, to store encoded data seen before the resync and decode it once the RLL codeword boundaries have been determined via the resync.

The Resync pattern 50 is not identifiable as part of a header. Therefore, as pointed out by Satomura, the resync pattern must not be confused with data since the appearance of the data codewords having the same pattern as the resync are likely to be detected instead as a resync pattern and not decoded as data, resulting in the loss of data. The approach of Satomura, discussed above, is to still allow identification of the resync pattern by its periodic location within the data. This approach is unreliable in view of possible errors or loss of some of the data, allowing the PLL to drift out of phase, or if the proper phase was never reached at the header. If phase-lock is not complete, or RLL decoder alignment does not occur properly, the detector may be unable to count to the periodic resync location and would be unable to detect that the pattern is a resync pattern.

One of the patterns suggested by Satomura is recognizable because it is outside the (k) constraint of the RLL code. The difficulty is that slight phase errors in data detection or slight bit shifts in the transitions comprising the resync pattern may instead result in the resync pattern appearing instead in encoded data.

In an RLL decoder, the resync pattern typically includes a long distance between at least 2 sequential transitions. A difficulty, particularly with magnetic transitions recorded on magnetic tape detected via peak detection, is that the intersymbol interference of high frequency signals tends to shift the detection of any transition away from a closely adjacent transition and towards the long no transition zone ("0"s) between the transitions. Thus, the detection circuitry tends to shift the transitions of the resync patterns closer together, and into positions such that they may instead be erroneously detected as data codewords and not as resync patterns.

Referring additionally to FIG. 1, in accordance with an embodiment of the present invention, a robust Resync pattern 50 is provided by a Resync generator 55, and inserted into the channel data bit stream within the codewords by write formatter 25, as will be explained. The Resync pattern comprises at least one string of "0"s which exceeds the RLL (k) constraint and therefore is not confused directly with any data codewords. Thus, in an RLL (1,7) or in an RLL (2,7) code, the Resync pattern would be "1000000001", having 8 consecutive "0"s between transitions. This pattern may also be called a "9T" pattern in view of the 9 clock distance between transitions.

In accordance with an embodiment of the present invention, the Resync pattern is made robust by implementing an RLL code in encoder 11 which excludes as codewords certain patterns, the certain patterns representing a bit shift from the Resync pattern of one or both "1" bits adjacent to the occurrence of at least one string of consecutive "0" bits, shifted to shorten the Resync pattern to within the (k) constraint. For example, the Resync pattern above may be subjected to bit shift which shifts the leading transition towards the trailing transition, or "0100000001", with the result that the (k) constraint is no longer exceeded. Similarly, the ending transition may be subjected to bit shift which shifts the trailing transition towards the leading transition, or "1000000010", again with the result that the (k) constraint is no longer exceeded. Lastly, both the leading and the trailing transitions may be shifted toward each other, or "0100000010", again within the (k) constraint. Thus, the present invention excludes those bit shift patterns from the codewords produced by the RLL encoder 11.

In accordance with another embodiment of the present invention, the Resync pattern 50 is provided with two different aspects, one of which is a low frequency aspect which violates excluded patterns and constraints of the RLL code, and another high frequency aspect which is additionally specifically excluded from the RLL code, such as a concatenated sequence of a bit pattern of predetermined length or greater. For example, the high frequency concatenated sequence may comprise a VFO pattern which is a repeating pattern of short bursts, such as 2T bursts, or "10"s. Although in an RLL (1,7) code, a 2T burst would not violate the "d" constraint, in accordance with the present invention, the full concatenated sequence of 2T bursts is also excluded from the possible codeword sequence of encoder 11, creating two separate exclusions for the Resync pattern.

As an example, the excluded VFO pattern may comprise strings of concatenated "10" bits 7 or more iterations long, and be excluded to allow detection of the VFO pattern. Thus, neither the VFO patterns 32 and 40 nor the Resync pattern 50 incorporating the concatenated string would be confused with encoded data. An exemplary Resync pattern taking the VFO pattern together with the string of "0"s which exceeds the RLL (k) constraint, for an RLL (1,7) code is "010000.000010.101010.101010".

Excluded bit shifted versions of the Resync pattern are as follows:
a) "010000.000100.101010.101010" represents a bit shift of the trailing transition of the string of "0"s, which both brings the string of "0"s within the (k) constraint and brings the concatenated string of "10" bit pairs to 6 repetitions and not excluded by the concatenated exclusion—this pattern must therefore be specifically excluded from the possible codeword outputs by encoder 11;
b) "001000.000100.101010.101010" represents a bit shift of both the leading and the trailing transitions of the string of "0"s, which again both brings the string of "0"s within the (k) constraint and brings the concatenated string of "10" bit pairs to 6 repetitions and not excluded by the concatenated exclusion this pattern must therefore be specifically excluded from the possible codeword outputs by encoder 11; and
c) "001000.000010.101010.101010" represents a bit shift of the leading transition of the string of "0"s, which is also excluded because of the VFO pattern exclusion.

Therefore, in the example of an RLL (1,7) fixed length code, the forbidden data encoding patterns are:
1) "11", the (d) constraint;
2) "00000000", the (k) constraint;
3) "10 10 10 10 10 10 10", 7 or more consecutive repetitions of "10";
4) "010000.000010.101010.101010", the Resync pattern;
5) "010000.000100.101010.101010", the Resync bit shift pattern (a), above;
6) "001000.000100.101010.101010", the Resync bit shift pattern (b), above; and
7) "001000.000010.101010.101010", the Resync bit shift pattern (c), above.

The Resync pattern is therefore highly robust, having all likely bit shift patterns thereof excluded from the encoded data, and incorporating an additional excluded "VFO" pattern as a second exclusion from the data.

The encoded data and incorporated Resync patterns, together with the appropriate format information, are provided by encoder 11, write formatter 25 and Resync generator 55. Specifically, write formatter 25 operates RLL encoder 31, the Resync generator 55 and a multiplexor 57 to arrange the encoded data, the Resync pattern, etc., in a desired format, and input the data stream to the write channel 12. The channel may comprise a transmission medium, or may comprise a data storage drive 15. If a data storage drive, the input to the channel may be recorded by a data storage drive on a data storage medium, such as magnetic tape or optical disk, and either archived or stored for a short term. In either case, at some point, the storage medium may be accessed and read by the same or a different data storage drive 15. The data read from the data storage drive, or received from the transmission over the channel 12 is provided at channel output 18. The encoded bit stream detected by the read channel 18 is decoded by decoder 20 and the Resync pattern detected by Resync detector 58. A signal indicating the detection of the Resync pattern by the Resync detector 58 is provided to a read formatter 59 which degates (does not pass through) the RLL decoder 20 for the duration of the Resync. The timing of the Resync is employed by the RLL decoder 20 so that the RLL decoder may gain the proper "framing" of the RLL codewords from the Resync pattern and maintain or regain alignment to the incoming codeword boundaries and start location.

The Resync detector 58 resolves patterns of the received bit stream, including a string of "0"s, in favor of the Resync pattern to accommodate bit shifts from the Resync pattern of one or both "1" bits adjacent to the occurrence of at least one long string of "0" bits, shifted to shorten the Resync pattern to within the (k) constraint. Additionally, if the received Resync pattern comprises both the string of "0" bits exceeding the RLL (k) constraint, and a concatenating pattern which comprises a concatenated sequence of a repeating bit pattern of a predetermined length, Resync detector 58 additionally resolves bit patterns of the received bit stream including both a string of "0"s and the concatenating pattern in favor of the Resync pattern.

As an example, where the received RLL (d,k) encoded channel bit stream comprises an RLL (1,7) encoded bit stream having at least one Resync pattern, and the Resync pattern string of "0"s comprises 8 consecutive "0" bits together with the concatenated pattern, as described above, the received patterns resolved by the decoder 20 and Resync detector 58 in favor of the Resync pattern comprise the following patterns:

a) "010000.000100.101010.101010";
b) "001000.000100.101010.101010"; and
c) "001000.000010.101010.101010".

In accordance with another aspect of the present invention, 3 bits of the Resync pattern are combined with linkage from the data to allow effective decoding of the Resync pattern and of the data without requiring a longer Resync pattern for separation from the data, e.g., to avoid violation of the (d)=1 constraint or to allow decoding by a sliding block decoder. Additionally, to provide the same capability for data written on magnetic tape, which may be read forward or backward, 3 bits at the beginning of the Resync pattern and 3 bits at the ending of the Resync pattern are combined with linkage from the data. The linkage may be of the form "xxx", with each "x" bit able to assume either a "1" or a "0" state based on the preceding data.

Thus, the 24 bit Resync pattern, above, may instead be written by encoding four fixed bits after the user data stream (effectively extending it), followed by an 18 bit partial Resync pattern "000000010101010101", follwed by the subsequent user data encoded starting at a given (fixed) state. This effectively extends codeword group 42 by four fixed bits and begins the encode of 43 from a fixed state.

A preferred embodiment, which is capable of providing sufficient numbers of different codewords to allow the incoming source data 10 to be unconstrained, is a run length limited (d,k) (1,7) code encoded at a rate of 4:6 (i.e., 4 source bits produce a codeword 6 channel bits long). A table illustrating an example of an RLL (1,7), rate 4:6, is shown in FIG. 3, and the allowed 6 bit codewords are shown in FIG. 4.

Also in a preferred embodiment, encoder 11 of FIG. 1 is a state machine having 7 states and responsive to 4 bit groups of source bits to provide 6 bit groups of channel bits. Other suitable RLL encoders may also be employed.

In the table of FIG. 3, the rows and columns are indexed by the 7 states of the encoder $\{1,2,\ldots,7\}$. Each present state has 16 outgoing transitions of the form x/y. Here, x is a 4 bit input (or user) label represented in hexadecimal (i.e., $\{0,1,\ldots,9,a,b,\ldots,f\}$). And y is a 6 bit label of the output codeword, the label represented as an integer $\{1,\ldots,21\}$ in accordance with the listing of FIG. 4. In FIG. 3, the present state of the transition is its row index and the next state of the transition is its column index. For example, there is a transition from state 3 to state 6 with user input e=1110 and label 3 corresponding to output codeword 000010.

One implementation of encoder logic which may be employed to implement the encoding represented by the state table of FIG. 3 is described in a table in FIG. 5. In the encoder logic, the present state is represented by a 3 bit label $s_2s_1s_0$. This present state 3 bit label, together with a 4 bit user label $b_3b_2b_1b_0$ determines the 6 bit output codeword $c_5c_4c_3c_2c_1c_0$ and the next state $t_2t_1t_0$.

The encoding conventions provide the linkage of 3 bits of the data combined with the Resync pattern, to allow effective decoding of the data by a sliding block decoder at the junction between data and an actual resync pattern, define the "xxx" bits at the end of the data and the beginning of the resync pattern. Using a 6 bit output format of the above example, the encoding conventions with respect to the encoder illustrated in FIGS. 3–5 will provide the last 6 bit channel word in a data stream will be of the form "xxx010" and the first 6 bit channel word will be of the form "010xxx".

The encoding conventions to produce the above channel codewords are as follows:

1 The 4 bit input (or user) word, "b" (in hex), is attached to the end of every input data stream and encoded (thus, the encoded data stream is 6 bits longer).

2 Encoding of an input data stream always begins at state 7.

It follows from encoding convention #1 and an examination of column 3 of the table of FIG. 3 that the last channel word in any encoded data stream is "xxx010" (ends in "010"), because "b" encodes to 3, 8, 11, 16 or 21, each of which corresponds (per the listing in FIG. 4) to an output label that ends in "010".

It follows from encoding convention #2 and an examination of row 7 of the table of FIG. 3 that the first channel word in any encoded data stream begins in "010", because from state 7, the 4 bit user words encode to 10, 11, 12 or 13, each of which corresponds (per the listing in FIG. 4) to an output label that begins in "010".

The linkage of the Resync pattern to the data adds no additional overhead. The Resync overhead really is 24 bits: the 18 bits from the partial resync pattern plus the 6 bits from the channel word, "xxx010", at the front which carries no user information. The channel word, "010xxx", at the back carries a full 4 bits of user information and so should not be counted as overhead.

With this linkage, any true copy of the Resync pattern or its two most likely bit shifts formed at the junction of encoded data and Resync will still be identified as the Resync pattern at the correct position.

FIG. 6 illustrates the data 4 bit inputs, the corresponding 6 bit current state outputs, and the next state of the encoder of FIGS. 3–5, and FIG. 7 illustrates the Resync pattern generated by Resync generator 55 in accordance with the state of the encoder of FIGS. 3–6 to provide the linkage with the encoded data.

An example of decoder 20 for decoding the channel data stream encoded by encoder 11 is a sliding block decoder with no memory and one 6 bit block of anticipation. Thus, the present 4 bit user word is recovered as a function of the present 6 bit channel word together with the next upcoming 6 bit channel word. This is illustrated in the table of FIG. 3 where: (1) any two appearances of the same output label y in the same column (i.e., with the same next states) have the same input label, and (2) any two appearances of the same output label y in different columns (i.e., with different next states) cannot be followed by a common output label.

The decoder function is shown in FIG. 8, whose rows are indexed by the present channel word and columns indexed by the next upcoming channel word. The decoder 20 thus depends on two consecutive 6 bit channel words to decode each 4 bit user word.

The decoder logic is described in FIG. 9. In the decoder logic the present 6 bit channel codeword $c_5c_4c_3c_2c_1c_0$, together with the next 6 bit channel codeword $d_5d_4d_3d_2d_1d_0$, determines the decoded 4 bit user codeword $b_3b_2b_1b_0$.

Since the decoder 20 depends on only two consecutive 6 bit channel words, a burst of at most 7 consecutive channel errors can contaminate at most 3 consecutive 4 bit user words, and thus at most 2 consecutive user bytes. Thus, a simple interleaved error correction code may be used to protect the data.

Figure 10:
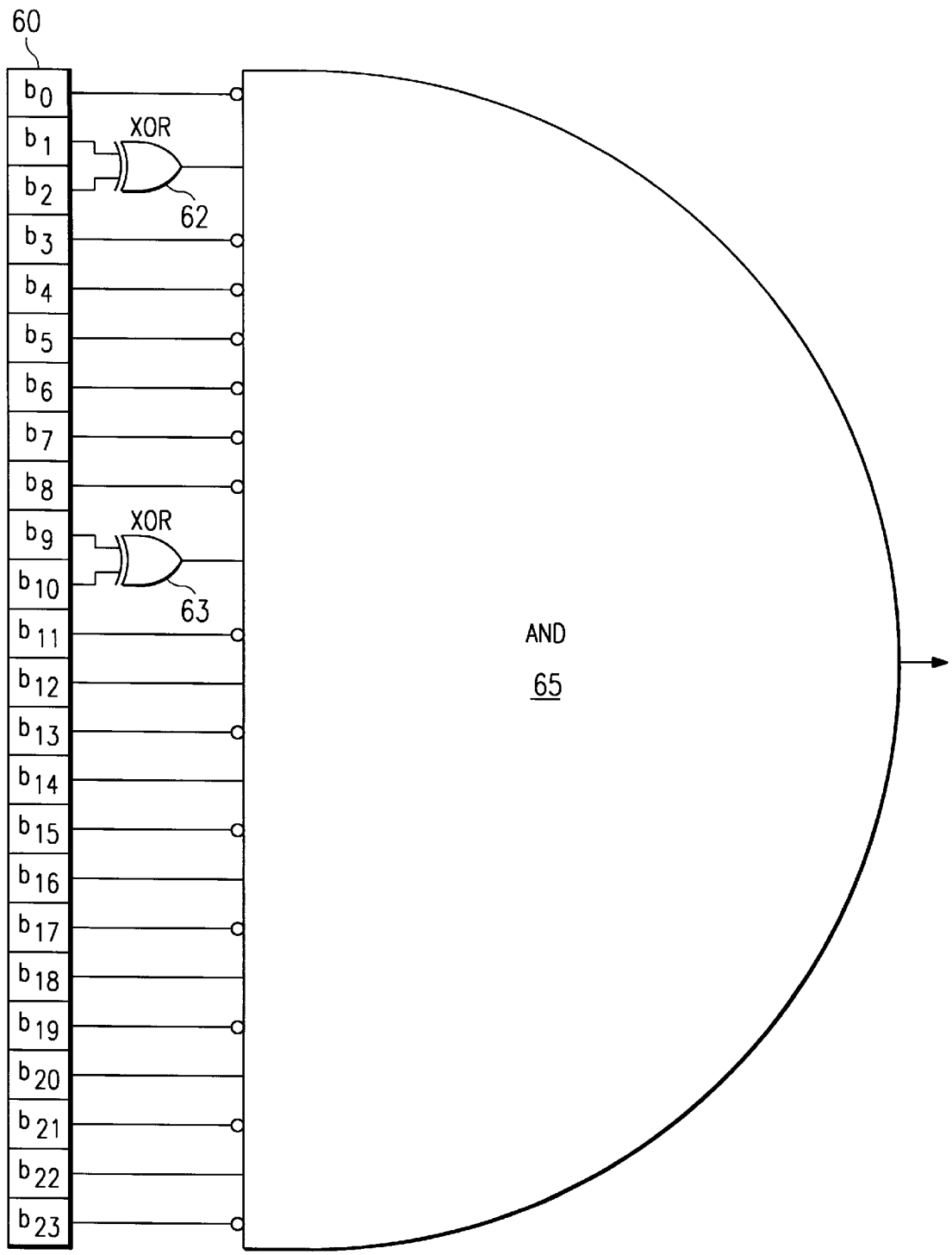
FIG. 10 is a block diagram of the Resync detector of FIG. 1.

An exemplary embodiment of Resync detector 58 of FIG. 1 is illustrated in FIG. 10. The incoming bits from read channel 18 are sequenced through a shift register and the 24 bits being tested are supplied to register 60. If we number the bits being tested for the Resync pattern 010000.000010.101010.101010 from left to right as $b_0,b_1, \ldots b_{23}$, and number the bits of the register 60 accordingly, the detection of the nominal Resync pattern and its two most likely bit shift positions may be conducted by exclusive OR logic 62 and 63, and AND logic 65. All of the inputs to the AND 65 which must be "0" to be detected are therefore inverted, so as to AND with the required "1" bit inputs. The input bits $b_1$ and $b_2$ and input bits $b_9$ and $b_{10}$ which may be the subject of bit shift are therefore exclusive ORed by logic 62 and 63 so as to be detected in either the correct or bit shifted position.

Any other suitable logic may be employed for the detection of the Resync patterns.

Referring to FIG. 2, the Resync detector 58 provides a synchronizing input to read formatter 59 which synchronizes the RLL decoder 20 with the RLL codewords.

Alternative RLL codes and corresponding encoders 11, resync generators 55, decoders 20 and resync detectors 58 can be envisioned employing the robust resync pattern of the present invention.

While the preferred embodiments of the present invention have been illustrated in detail, it should be apparent that modifications and adaptations to those embodiments may occur to one skilled in the art without departing from the scope of the present invention as set forth in the following claims.

We claim:

1. A method for encoding a series of unconstrained binary source signals into a run length limited (d,k) code, comprising the steps of:

receiving groups of said binary source signals; and
    RLL encoding said groups of said binary source signals to provide RLL channel groups of binary signals, said RLL channel groups comprising a stream of bits excluding the following patterns:
    1) patterns having fewer "0" bits than said RLL (d) constraint;
    2) patterns having more "0" bits than said RLL (k) constraint;
    3) a Resync pattern having at least one string of consecutive "0" bits exceeding said RLL (k) constraint; and
    4) at least one pattern representing a bit shift from said Resync pattern comprising shifts of one or both "1" bits adjacent to said occurrence of at least one string of "0" bits, shifted to shorten said Resync pattern to within said (k) constraint.

2. The method for encoding of claim 1, wherein said RLL encoding step additionally excludes a concatenating pattern which comprises a concatenated sequence of a repeating bit pattern of a predetermined length, and wherein said Resync pattern comprises both said string of consecutive "0" bits exceeding said RLL (k) constraint, and said concatenating pattern.

3. The method for encoding of claim 2, wherein said RLL encoding step Resync pattern additionally comprises a preceding "xxx010" bit pattern representing patterns of 4 bits related to an immediately preceding channel group.

4. The method for encoding of claim 1, wherein said run length limited code comprises a (1,7) code, and wherein said RLL encoding step Resync pattern string of consecutive "0" bits is of length 8.

5. The method for encoding of claim 4, wherein said RLL encoding step additionally excludes a VFO pattern which comprises a concatenated sequence of a repeating pattern of "10" bit pairs of a predetermined length, and wherein said Resync pattern comprises both said string of 8 consecutive "0" bits exceeding said RLL (k) constraint, and said VFO pattern.

6. The method for encoding of claim 5, wherein said run length limited (1,7) code encodes bits at a rate of 4:6, and wherein said VFO pattern comprises a sequence of concatenated "10" bit pairs longer than 6 iterations, and wherein said RLL encoding step Resync pattern comprises "010000.000010.101010.101010".

7. The method for encoding of claim 6, wherein said RLL encoding step excluded patterns representing said Resync bit shift comprise the following patterns:
    a) "010000.000100.101010.101010";
    b) "001000.000100.101010.101010"; and
    c) "001000.000010.101010.101010".

8. A method for generating a robust Resync pattern into a channel stream of run length limited (d,k) encoded bits, comprising the steps of:

encoding said Resync pattern, including at least one string of consecutive "0"s exceeding said RLL (k) constraint, into said channel bit stream; and
    excluding certain patterns from said RLL (d,k) channel bit stream, said certain patterns comprising said Resync pattern and patterns representing a bit shift from said Resync pattern of one or both "1" bits adjacent to said occurrence of at least one string of "0" bits, shifted to shorten said Resync pattern to within said (k) constraint.

9. The method for generating said Resync pattern of claim 8, wherein said encoding step Resync pattern comprises both said string of consecutive "0" bits exceeding said RLL (k) constraint, and a concatenating pattern which comprises a concatenated sequence of a repeating bit pattern of a predetermined length, and wherein said excluding step additionally excludes said concatenating pattern.

10. The method for generating said Resync pattern of claim 9, wherein said encoding step Resync pattern additionally comprises a preceding "xxx010" bit pattern representing patterns of 4 bits related to immediately preceding channel RLL bits.

11. The method for generating said Resync pattern of claim 8, wherein said run length limited code comprises a (1,7) code, and wherein said encoding step Resync pattern string of consecutive "0"s comprises 8 consecutive "0" bits.

12. The method for generating said Resync pattern of claim 11, wherein said encoding step Resync pattern comprises both said string of 8 consecutive "0" bits exceeding said RLL (k) constraint, and a VFO pattern which comprises a concatenated sequence of a repeating pattern of "10" bit pairs of a predetermined length, and wherein said excluding step additionally excludes said VFO pattern.

13. The method for generating said Resync pattern of claim 12, wherein said encoding step Resync pattern comprises "010000.000010.101010.101010".

14. An encoder for producing a run length limited (RLL) code of binary bit signals from a series of unconstrained binary source signals in a structurally constrained environment, said code having a minimum of (d) and a maximum of (k) "0"s between adjacent "1" bits, comprising:

a source for receiving said binary source signals; and an RLL encoder coupled to said source for receiving groups of said binary source signals and responding to said source groups of said binary source signals to provide RLL channel groups of binary signals encoded in said RLL code, said RLL channel groups comprising a stream of bits excluding the following patterns:

1) patterns having fewer "0" bits than said RLL (d) constraint;

2) patterns having more "0" bits than said RLL (k) constraint;

3) a Resync pattern having at least one string of consecutive "0" bits exceeding said RLL (k) constraint; and 4) patterns representing a bit shift from said Resync pattern comprising shifts of one or both "1" bits adjacent to said occurrence of at least one string of consecutive "0" bits, shifted to shorten said Resync pattern to within said (k) constraint.

15. The RLL encoder of claim 14, wherein said RLL encoder additionally excludes a concatenating pattern which comprises a concatenated sequence of a repeating bit pattern of a predetermined length, and wherein said Resync pattern comprises both said string of consecutive "0" bits exceeding said RLL (k) constraint, and said concatenating pattern.

16. The RLL encoder of claim 15, wherein said Resync pattern additionally comprises a preceding "xxx010" bit pattern representing patterns of 4 bits related to an immediately preceding channel group encoded by said RLL encoder.

17. The RLL encoder of claim 14, wherein said RLL encoder run length limited code comprises a (1,7) code, and wherein said Resync pattern string of consecutive "0"s comprises 8 consecutive "0" bits.

18. The RLL encoder of claim 17, wherein said RLL encoder additionally excludes a VFO pattern which comprises a concatenated sequence of a repeating pattern of "10" bit pairs of a predetermined length, and wherein said Resync pattern comprises both said string of 8 consecutive "0" bits exceeding said RLL (k) constraint, and said VFO pattern.

19. The RLL encoder of claim 18, wherein said RLL encoder run length limited (1,7) code encodes at a rate of 4:6, representing 4 bit entered groups and 6 bit RLL channel groups, wherein said excluded VFO pattern comprises a sequence of concatenated "10" bit pairs longer than 6 iterations, and wherein said Resync pattern comprises "010000.000010.101010.101010".

20. The RLL encoder of claim 19, wherein said RLL encoder excluded patterns representing said Resync bit shift comprises the following patterns:

a) "010000.000100.101010.101010"; and b) "001000.000100.101010.101010"; and c) "001000.000010.101010.101010".

21. An encoder for generating a robust Resync pattern into a channel bit stream of run length limited (d,k) bit signals, comprising:

a Resync generator for producing said Resync pattern, including at least one string of consecutive "0"s exceeding said RLL (k) constraint, into said channel bit stream; and an RLL encoder for encoding said RLL (d,k) binary bit signals in said channel bit stream from a series of unconstrained binary source signals, said RLL encoder excluding certain patterns from said RLL (d,k) channel bit stream, said certain patterns comprising said Resync pattern and patterns representing a bit shift from said Resync pattern of one or both "1" bits adjacent to said occurrence of at least one string of consecutive "0" bits, shifted to shorten said Resync pattern to within said (k) constraint.

22. The Resync pattern encoder of claim 21, wherein said Resync generator produced Resync pattern comprises both said string of consecutive "0" bits exceeding said RLL (k) constraint, and a concatenating pattern which comprises a concatenated sequence of a repeating bit pattern of a predetermined length, and wherein said RLL encoder additionally excludes said concatenating pattern.

23. The Resync pattern encoder of claim 22, wherein said Resync generator produced Resync pattern additionally comprises a preceding "xxx010" bit pattern representing patterns of 4 bits related to immediately preceding channel RLL bits.

24. The Resync pattern encoder of claim 21, wherein said run length limited code comprises a (1,7) code, and wherein said Resync generator produced Resync pattern string of consecutive "0"s comprises 8 consecutive "0" bits.

25. The Resync pattern encoder of claim 24, wherein said Resync generator produced Resync pattern comprises both said string of 8 consecutive "0" bits exceeding said RLL (k) constraint, and a VFO pattern which comprises a concatenated sequence of a repeating pattern of "10" bit pairs of a predetermined length, and wherein said RLL encoder additionally excludes said VFO pattern.

26. The Resync pattern encoder of claim 25, wherein said Resync generator produced Resync pattern comprises "010000.000010.101010.101010".

27. A method for decoding a run length limited (d,k) encoded channel bit stream having at least one Resync pattern therein, said Resync pattern having a string of consecutive "0"s exceeding said (k) constraint of said RLL code, comprising:

receiving said encoded channel bit stream;

grouping said encoded channel bit stream into predetermined length sliding block groups;

responding to said groups to decode patterns of said received bit stream; and detecting said Resync pattern and resolving bit shifts from said Resync pattern of one or both "1" bits adjacent to said occurrence of at least one string of consecutive "0" bits, shifted to shorten said Resync pattern to within said (k) constraint in favor of said Resync pattern, said detected Resync pattern synchronizing said sliding block groups.

28. The RLL decoding method of claim 27, wherein said received Resync pattern comprises both said string of consecutive "0" bits exceeding said RLL (k) constraint, and a VFO pattern which comprises a concatenated sequence of a repeating bit pattern of a predetermined length, and wherein said detecting step additionally resolves bit patterns of said received bit stream including both said string of consecutive "0"s and said VFO pattern in favor of said Resync pattern.

29. The RLL decoding method of claim 28, wherein said received RLL (d,k) encoded channel bit stream comprises a (1,7) encoded bit stream having at least one said Resync pattern therein, said Resync pattern string of consecutive "0"s comprises 8 consecutive "0" bits, and wherein said detecting step resolves the following patterns in favor of said Resync pattern:

a) "010000.000100.101010.101010";
b) "001000.000100.101010.101010"; and
c) "001000.000010.101010.101010".

30. A decoder for decoding a run length limited (d,k) encoded bit stream having at least one Resync pattern therein, said Resync pattern having a string of consecutive "0"s exceeding said (k) constraint of said RLL code, and for recovering said Resync pattern, comprising:

an input for receiving said encoded bit stream;

a sliding block decoder coupled to said input for decoding said encoded bit stream; and a Resync detector coupled to said input for recovering said Resync pattern, said Resync detector resolving patterns of said received bit stream which include said string of consecutive "0"s and one or two bit shorter strings of consecutive "0"s in favor of said Resync pattern to accommodate bit shifts from said Resync pattern of one or both "1" bits adjacent to said occurrence of at least one string of consecutive "0" bits, shifted to shorten said Resync pattern to within said (k) constraint.

31. The RLL decoder of claim 30, wherein said received Resync pattern comprises both said string of consecutive "0" bits exceeding said RLL (k) constraint, and a concatenating pattern which comprises a concatenated sequence of a repeating bit pattern of a predetermined length, and wherein said Resync detector additionally resolves bit patterns of said received bit stream including both said strings of consecutive "0"s and said concatenating pattern in favor of said Resync pattern.

32. The RLL decoder of claim 31, wherein said received RLL (d,k) encoded channel bit stream comprises a (1,7) encoded bit stream having at least one said Resync pattern therein, said Resync pattern string of consecutive "0"s comprises 8 consecutive "0" bits, and wherein said received patterns resolved by said detector in favor of said Resync pattern comprise the following patterns:

a) "010000.000100.101010.101010";
b) "001000.000100.101010.101010"; and
c) "001000.000010.101010.101010".

33. An encoder/decoder for generating a robust Resync pattern into a channel bit stream of run length limited (d,k) bit signals, and for recovering said Resync pattern from said run length limited (d,k) encoded channel bit stream having at least one Resync pattern therein, comprising:

a Resync generator for producing said Resync pattern, including at least one string of consecutive "0"s exceeding said RLL (k) constraint, into said channel bit stream;

an RLL encoder for encoding said RLL (d,k) binary bit signals in said channel bit stream from a series of unconstrained binary source signals, said encoder excluding certain patterns from said RLL (d,k) channel bit stream, said certain patterns representing a bit shift from said Resync pattern of one or both "1" bits adjacent to said occurrence of at least one string of consecutive "0" bits, shifted to shorten said Resync pattern to within said (k) constraint;

a channel coupled to said Resync generator and said RLL encoder for transmitting said encoded bit stream and for receiving said encoded bit stream;

a data decoder coupled to said channel for decoding said encoded bit stream; and a Resync detector coupled to said channel for recovering said Resync pattern, said Resync detector resolving patterns of said received bit stream which include said string of consecutive "0"s and one or two bit shorter strings of consecutive "0"s in favor of said Resync pattern to accommodate bit shifts from said Resync pattern of one or both "1" bits adjacent to said occurrence of at least one string of consecutive "0" bits, shifted to shorten said Resync pattern to within said (k) constraint.

34. The RLL encoder/decoder of claim 33, wherein said Resync generator produced Resync pattern comprises both said string of consecutive "0" bits exceeding said RLL (k) constraint, and a VFO pattern which comprises a concatenated sequence of a repeating bit pattern of a predetermined length, and wherein said RLL encoder additionally excludes said VFO pattern; and wherein said Resync detector additionally resolves bit patterns of said received bit stream including both said strings of consecutive "0"s and said VFO pattern in favor of said Resync pattern.

35. The RLL encoder/decoder of claim 34, wherein said RLL encoder encoded run length limited code comprises a (1,7) code;

wherein said Resync generator produced Resync pattern string of consecutive "0"s comprises 8 consecutive "0" bits; and wherein said received patterns resolved by said detector in favor of said Resync pattern comprise the following patterns:

a) "010000.000100.101010.101010" ;
b) "001000.000100.101010.101010"; and
c) "001000.000010.101010.101010".

36. A data recording encoder/decoder for generating a robust Resync pattern into a data recording bit stream of run length limited (d,k) bit signals, and for recovering said Resync pattern from said recorded run length limited (d,k) encoded bit stream having at least one Resync pattern therein, comprising:

a Resync generator for producing said Resync pattern, including at least one string of consecutive "0"s exceeding said RLL (k) constraint, into said channel bit stream;

an RLL encoder for encoding said RLL (d,k) binary bit signals in said channel bit stream from a series of unconstrained binary source signals, said encoder excluding certain patterns from said RLL (d,k) channel bit stream, said certain patterns comprising said Resync pattern and patterns representing a bit shift from said Resync pattern of one or both "1" bits adjacent to said occurrence at least one string of consecutive "0" bits, shifted to shorten said Resync pattern to within said (k) constraint;

a data storage device coupled to said Resync generator and said RLL encoder for recording said encoded bit stream and for retrieving said recorded encoded bit stream;

a data decoder coupled to said data storage device for decoding said retrieved encoded bit stream; and a Resync detector coupled to said data storage device for recovering said Resync pattern, said Resync detector resolving patterns of said received bit stream which include said string of consecutive "0"s and one or two bit shorter strings of consecutive "0"s in favor of said Resync pattern to accommodate bit shifts from said Resync pattern of one or both "1" bits adjacent to said occurrence of at least one string of consecutive "0" bits, shifted to shorten said Resync pattern to within said (k) constraint.

37. The data recording RLL encoder/decoder of claim 36, wherein said Resync generator produced Resync pattern comprises both said string of consecutive "0" bits exceeding said RLL (k) constraint, and a concatenating pattern which comprises a concatenated sequence of a repeating bit pattern of a predetermined length, and wherein said RLL encoder additionally excludes said concatenating pattern; and wherein said Resync detector additionally resolves bit patterns of said received bit stream including both said strings of consecutive "0"s and said concatenating pattern in favor of said Resync pattern.

38. The data recording RLL encoder/decoder of claim 37, wherein said RLL encoder encoded run length limited code comprises a (1,7) code;

wherein said Resync generator produced Resync pattern string of consecutive "0"s comprises 8 consecutive "0" bits; and wherein said received patterns resolved by said detector in favor of said Resync pattern comprise the following patterns:
  a) "010000.000100.101010.101010";
  b) "001000.000100.101010.101010"; and
  c) "001000.000010.101010.101010".

39. A data recording medium having recorded binary signals, comprising:

a recording medium;

recorded streams of run length limited (d,k) constrained groups of binary signals excluding the following patterns:
    1) patterns having fewer "0" bits than said RLL (d) constraint;
    2) patterns having more "0" bits than said RLL (k) constraint;
    3) a Resync pattern having at least one string of consecutive "0" bits exceeding said RLL (k) constraint; and
    4) at least one pattern representing a bit shift from said Resync pattern comprising shifts of one or both "1" bits adjacent to said occurrence of at least one string of "0" bits, shifted to shorten said Resync pattern to within said (k) constraint; and at least one recorded said Resync pattern interspersed in said recorded streams of binary signals.

40. The data recording medium of claim 39, wherein said recorded streams of RLL constrained binary signals additionally excludes a concatenating pattern which comprises a concatenated sequence of a repeating bit pattern of a predetermined length, and wherein said Resync pattern comprises both said string of consecutive "0" bits exceeding said RLL (k) constraint, and said concatenating pattern.

41. The data recording medium of claim 40, wherein said recorded Resync pattern additionally comprises a preceding "xxx010" bit pattern representing patterns related to said RLL constrained binary signals immediately preceding said Resync pattern.

42. The data recording medium of claim 39, wherein said run length limited code comprises a (1,7) code, and wherein said recorded Resync pattern string of consecutive "0" bits is of length 8.

43. The data recording medium of claim 42, wherein said recorded streams of RLL constrained binary signals additionally excludes a VFO pattern which comprises a concatenated sequence of a repeating pattern of "10" bit pairs of a predetermined length, and wherein said Resync pattern comprises both said string of 8 consecutive "0" bits exceeding said RLL (k) constraint, and said VFO pattern.

44. The data recording medium of claim 43, wherein said run length limited (1,7) code encodes bits at a rate of 4:6, and wherein said VFO pattern comprises a sequence of concatenated "10" bit pairs longer than 6 iterations, and wherein said recorded Resync pattern comprises "010000.000010.101010.101010".

45. The data recording medium of claim 44, wherein said recorded streams of RLL constrained binary signals excluded patterns representing said Resync bit shift comprise the following patterns:
  a) "010000.000100.101010.101010";
  b) "001000.000100.101010.101010"; and
  c) "001000.000010.101010.101010".

* * * * *